United States Patent
Sit et al.

(10) Patent No.: US 7,152,140 B2
(45) Date of Patent: Dec. 19, 2006

(54) MASKING PARITY INFORMATION ASSOCIATED WITH A TERNARY CONTENT ADDRESSABLE MEMORY

(75) Inventors: Kin Yip Sit, Sunnyvale, CA (US); Kavitha A. Prasad, San Jose, CA (US); Miguel Guerrero, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 457 days.

(21) Appl. No.: 10/464,237

(22) Filed: Jun. 18, 2003

(65) Prior Publication Data

US 2004/0260868 A1 Dec. 23, 2004

(51) Int. Cl.
*G06F 12/16* (2006.01)
(52) U.S. Cl. .................. 711/108; 714/800; 714/801
(58) Field of Classification Search ................. 711/108
See application file for complete search history.

(56) References Cited

U.S. PATENT DOCUMENTS

| | | | | |
|---|---|---|---|---|
| 6,067,656 A | * | 5/2000 | Rusu et al. ............. | 714/768 |
| 6,760,881 B1 | * | 7/2004 | Batson et al. ............ | 714/773 |
| 6,775,737 B1 | * | 8/2004 | Warkhede et al. ........ | 711/108 |
| 6,839,256 B1 | * | 1/2005 | Proebsting et al. ........ | 365/49 |
| 6,879,504 B1 | * | 4/2005 | Lien et al. ................ | 365/49 |
| 6,914,795 B1 | * | 7/2005 | Srinivasan et al. ........ | 365/49 |
| 2004/0015752 A1 | * | 1/2004 | Patella et al. ............ | 714/718 |
| 2004/0083421 A1 | * | 4/2004 | Foss et al. ............... | 714/805 |
| 2005/0010719 A1 | * | 1/2005 | Slavin ..................... | 711/108 |

OTHER PUBLICATIONS

Jien-Chung Lo, "Fault Tolerant Content Addressable Memory," 1993 IEEE.*

* cited by examiner

*Primary Examiner*—Brian R. Peugh
*Assistant Examiner*—Jesse Diller
(74) *Attorney, Agent, or Firm*—Buckley, Maschoff & Talwalkar LLC

(57) ABSTRACT

According to some embodiments, a parity check is provided for ternary content addressable memory. For example, it may be arranged for a read request to be transmitted to a ternary content addressable memory unit. Data content may then be received from the memory unit in response to the read request, a parity check may be performed on the data content. According to some embodiments, parity information may be masked when the memory unit is queried.

26 Claims, 7 Drawing Sheets

MASKING PARITY INFORMATION ASSOCIATED WITH A TERNARY CONTENT ADDRESSABLE MEMORY

BACKGROUND

A parity check may be performed to verify information stored in a memory unit (e.g., to ensure that no soft error was introduced due to a failure of a cell in the memory unit). For example, an exclusive OR operation may be performed on data as it is stored into a Random Access Memory (RAM) unit. This parity information may be stored in the RAM unit along with the data. The data and parity information may then be verified when it is retrieved from the RAM unit (e.g., by re-performing the exclusive OR operation on the data and comparing the result to the retrieved parity information).

Because of the technology involved, information stored in a Ternary Content Addressable Memory (TCAM) unit has not traditionally required protection against soft errors. As the sizes of elements used in a TCAM unit are reduced, however, the memory cells may become more susceptible to soft errors.

DETAILED DESCRIPTION

In a typical RAM unit, a write instruction may store a particular set of data in a particular memory address (e.g., 01011011 might be stored into address 512). Similarly, a read instruction may retrieve a particular set of data from a particular address (e.g., 01011011 might be retrieved from address 512). If the address of a particular set of data needs to be determined, read instructions can be sequentially performed on addresses in the RAM unit (e.g., by reading from address 3, address 4, address 5). The information retrieved from each address can then be compared to the desired set of data until a match is found.

In contrast, a Content Addressable Memory (CAM) unit can be used to directly determine the memory address associated with a particular set of data. In particular, a query instruction includes a "key" representing that set of data. The CAM unit responds to the query by indicating a memory address where that set of data is currently stored. Note that write and read instructions can also be used with a CAM unit (to write data into and to read data from particular addresses).

In a "Ternary" CAM (TCAM) unit, a bit can represent either a zero ("0"), a one ("1"), or a don't care value ("x"). For example, a TCAM may be used to find the first entry that is currently storing 001111xx (and the TCAM may respond by indicating a memory address where any of 00111100, 00111101, 00111110, or 00111111 are stored).

A don't care value might be supported using masks for each entry in the TCAM unit. For example, a TCAM entry might include:

TABLE I

|  | $b_7$ | $b_6$ | $b_5$ | $b_4$ | $b_3$ | $b_2$ | $b_1$ | $b_0$ |
|---|---|---|---|---|---|---|---|---|
| data: | 0 | 0 | 1 | 1 | 1 | 1 | 0 | 0 |
| mask: | 0 | 0 | 0 | 0 | 0 | 0 | 1 | 1 |

In this case, a key of 10111100 would not match the entry, because the data's Most Significant Bit (MSB) does not match the key's MSB. A key of 00111101, on the other hand, would match the entry, because the Least Significant Bit (LSB) of the mask (i.e., "1") indicates that the data's LSB of the data does not need to match the key's LSB. A don't care value could also be supported using a global mask that applies to all entries in the TCAM unit. Moreover, both per-entry and global masks could be supported.

A TCAM unit may be used in a communication device (e.g., a network switch or router). For example, Internet Protocol (IP) addresses may be stored in the TCAM unit. The memory address associated with the a portion of the IP address may then be determined using a query instruction.

TCAM Parity Check System

Figure 1:
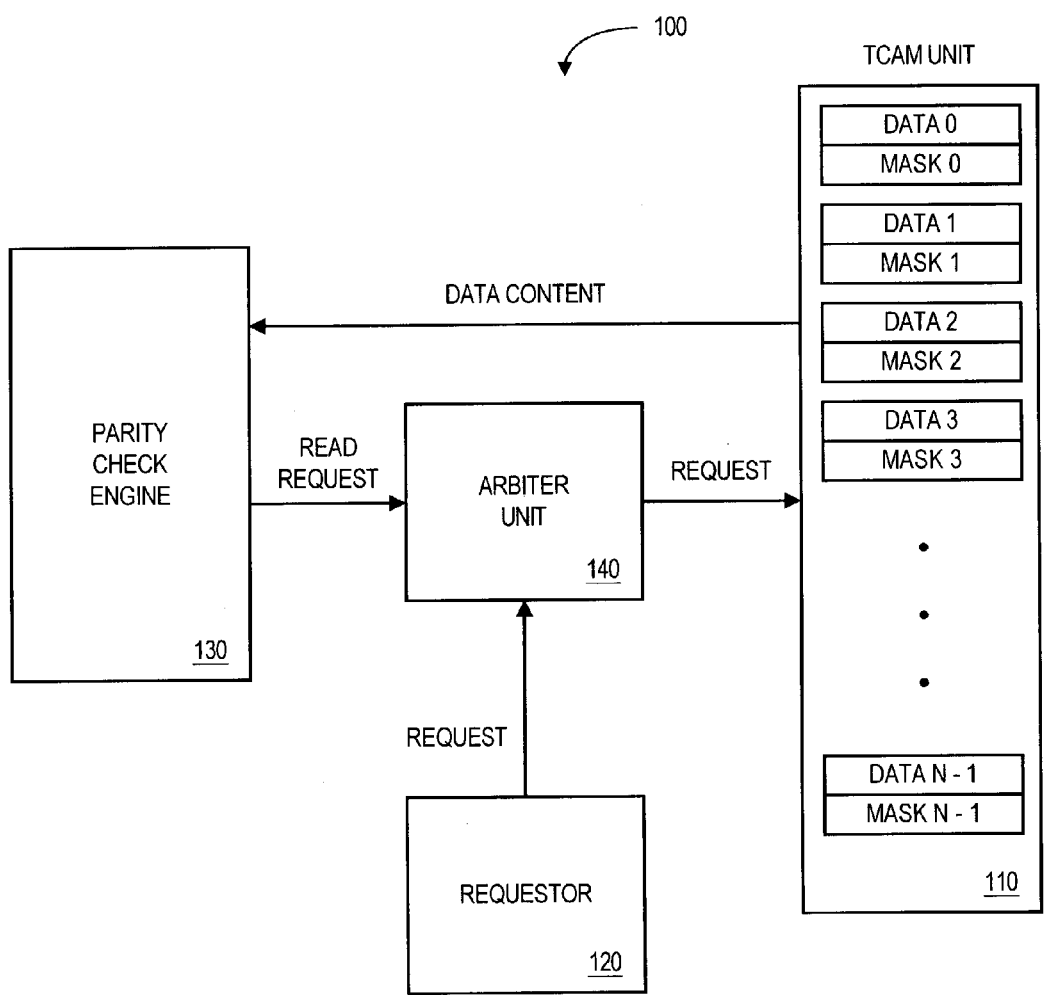
FIG. 1 is a block diagram of a TCAM parity check system according to some embodiments.

FIG. 1 is a block diagram of a TCAM parity check system 100 according to some embodiments. The system 100 includes a TCAM unit 110 to store entries (e.g., entries that include a data portion and a mask portion). The TCAM unit 110 may be X bits wide and N entries deep (e.g., 16 bits wide and 1024 entries deep).

A requester 120 may provide write, read, and/or query requests for the TCAM unit 110. For example, the requestor 120 might be a hardware, software, or firmware device that generates a read request for a particular memory address. The TCAM unit 110 would then respond to the read request with the data that is stored at that memory address. Although a single requestor 120 is illustrated in FIG. 1, the system 100 can include multiple requesters 120.

Note that the typical approach to performing parity checks (e.g., creating parity information when data is stored into a RAM unit and checking the parity information when data is retrieved from the RAM unit) may not be practical for a TCAM unit. For example, a soft error in the TCAM unit 110 might not be detected. Assume that 00001111 is stored in a particular address, and a soft error in the MSB causes the data to become 10001111. If a requestor 120 generates a query having a key of 00001111, the TCAM unit 110 will not indicate the memory address in response to the query (and thus no parity check would be performed on the data that actually contains the error). Moreover, implementing hardware to check every cell in the TCM unit 110 (e.g., once each cycle) introduce a significant amount of area overhead.

According to some embodiments, a parity check engine 130 generates read requests for the TCAM unit 110. For example, the parity check engine 130 may read data from a particular address in the TCAM unit 110 and perform a parity check on the data. Moreover, an arbiter unit 140 may facilitate read requests from the parity check engine 130 (along with requests from the requester 120).

Figure 2:
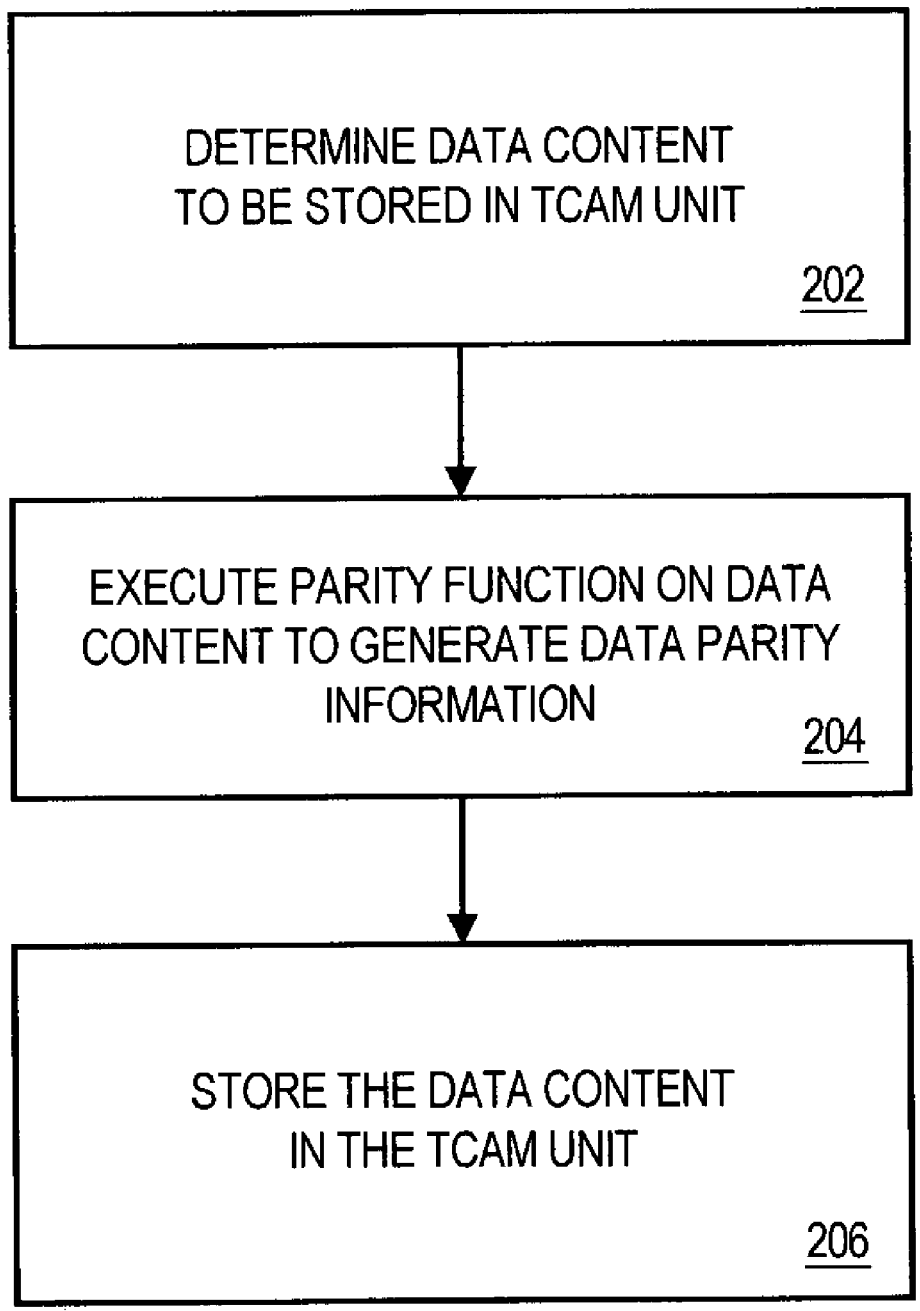
FIG. 2 is a method of storing data content in a TCAM unit according to some embodiments.

FIG. 2 is a method that may be used to store data in the TCAM unit 110 according to some embodiments. The method may be performed, for example, by the requestor 120 when it performs a write instruction. The flow charts described herein do not necessarily imply a fixed order to the actions, and embodiments may be performed in any order that is practicable. Note that any of the methods described herein may be performed by firmware, hardware, software, or any combination of these techniques. For example, a storage medium may store thereon instructions that when executed by a machine result in performance according to any of the embodiments described herein.

At 202, data content to be stored in the TCAM unit 110 is determined. For example, the requester 120 might determine that a particular set of data should be stored into the TCAM unit 110.

At 204, a parity function is executed on the data content to generate data parity information. For example, a hardware or software device could perform an exclusive OR operation on the data content to generate a single parity bit.

At 206, the data content is stored in the TCAM unit 110. According to some embodiments, the data parity information is also stored in the TCAM unit 110. According to other embodiments, the data parity information is instead stored in a separate memory structure.

Similarly, mask content to be stored in the TCAM unit 110 may be determined, and a parity function may be executed on the mask content to generate mask parity information. The mask content can then be stored in the TCAM unit 110 (with or without the mask parity information).

According to some embodiments, it is arranged for the data and mask parity information to be masked during a subsequent query as described below with respect to FIGS. 3 and 4.

TCAM Data Structure that Supports Global Masking

Figure 3:
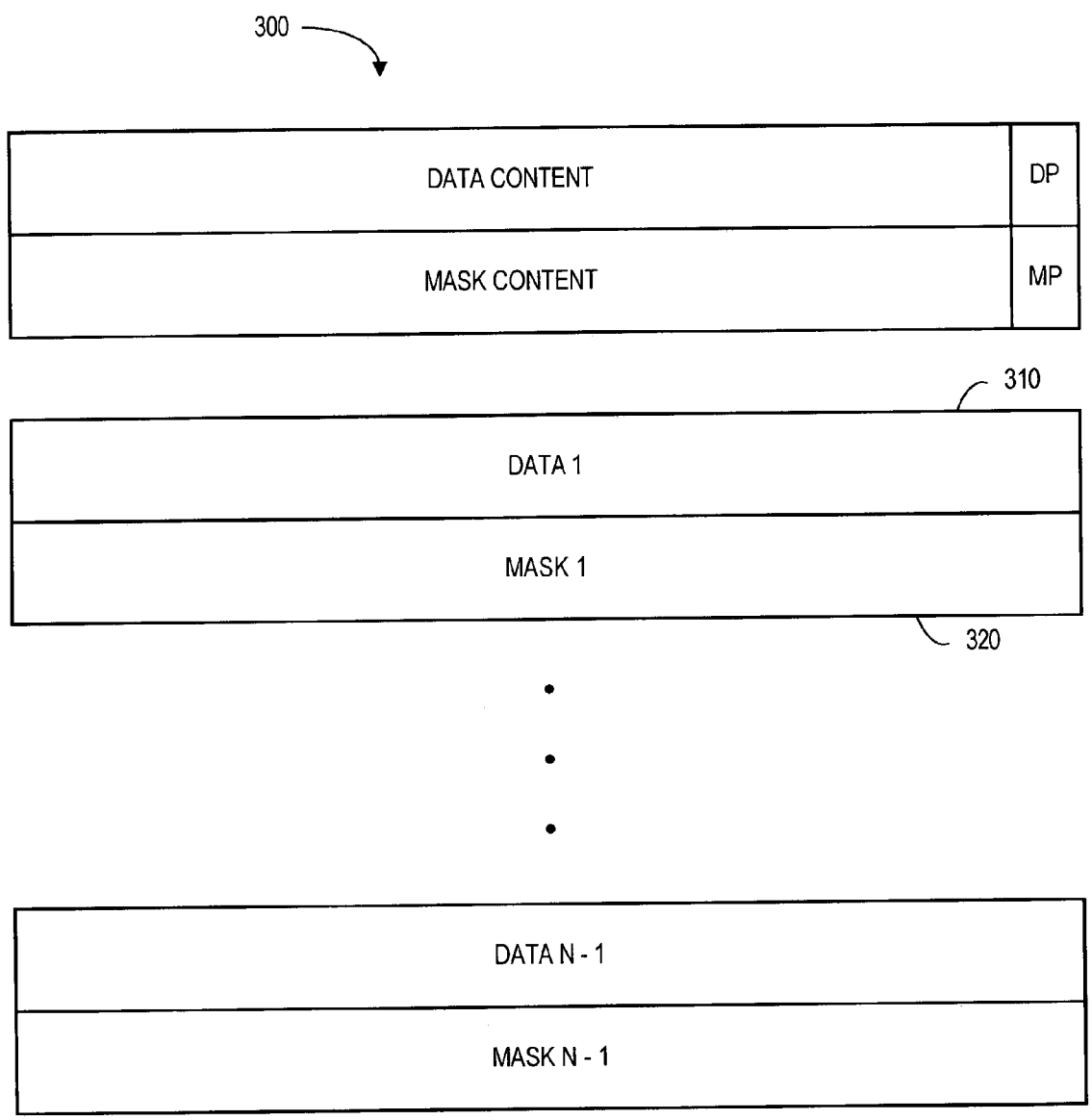
FIG. 3 illustrates a data structure for a TCAM unit according to some embodiments.

FIG. 3 illustrates a data structure 300 for a TCAM unit 110 that supports global masking according to some embodiments. Each of the N entries in the TCAM unit 110 includes a data portion 310 and a mask portion 320.

Each data portion 310 is divided into a data content field and a data parity field ("DP"). If, for example, the TCAM unit 110 is sixteen bits wide and the data parity field is a single bit, then the data content field would contain fifteen bits. Similarly, each mask portion 320 is divided into a mask content field and a mask parity field ("MP"). Note that the data and mask parity fields do not need to be a single bit (e.g., two parity bits may be provided). Moreover, the data and mask parity fields do not need to be located at the LSB (e.g., they could instead be located at the MSB).

According to this embodiment, the bits in the global mask that correspond to the data and mask parity fields can be used to mask the parity information during a query. Consider, for example, an eight-bit wide entry having a single data parity bit and a single mask parity bit. The data portion 310 might use bit bo as the data parity field and bits $b_1$ through $b_7$ as the data content field. Similarly, the mask portion 320 might use bit $b_0$ as the mask parity field and bits $b_1$ through $b_7$ as the mask content field:

TABLE II

| | $b_7$ | $b_6$ | $b_5$ | $b_4$ | $b_3$ | $b_2$ | $b_1$ | $b_0$ |
|---|---|---|---|---|---|---|---|---|
| data portion: | | | data content | | | | | DP |
| mask portion: | | | mask content | | | | | MP |
| global mask: | | | | | | | | 1 |

In this case, the LSB of the global mask may always be set to "1" when a query is performed and, as a result, the parity information stored in the TCAM unit 110 will be masked. Note that storing the data and mask parity portions in corresponding locations (e.g., $b_0$) may increase the data and mask content that does not need to be masked.

TCAM Data Structure that does not Support Global Masking

Figure 4:
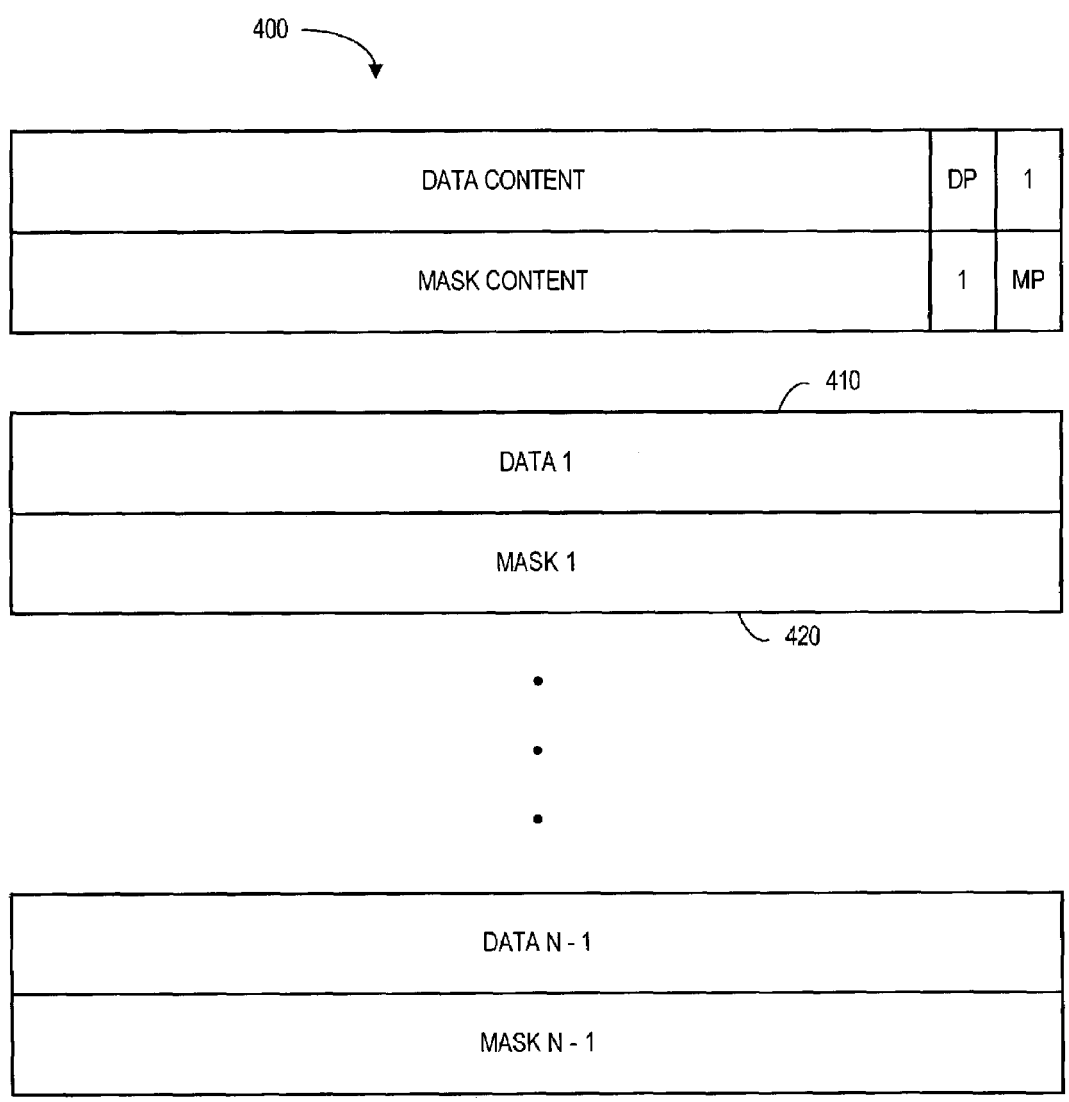
FIG. 4 illustrates a data structure for a TCAM unit according to other embodiments.

FIG. 4 illustrates a data structure 400 for a TCAM unit 110 that does not support global masking according to other embodiments. As before, Each of the N entries in the TCAM unit 110 includes a data portion 410 and a mask portion 420.

Each data portion 410 includes a data content field and a data parity field ("DP"). Similarly, each mask portion 420 includes a mask content field and a mask parity field ("MP"). According to this embodiment, the mask parity field is located in a position other than the one occupied by the data parity field. Moreover, the position in the data portion 410 that corresponds to the position of the mask parity field is set to "1" and the position in the mask portion 420 that corresponds to the position of the data parity filed is set to "1." If, for example, the TCAM unit 110 is sixteen bits wide and the data and mask parity fields are each a single bit, then the data content field would contain fourteen bits.

As before the data and mask parity fields do not need to be a single bit nor do they need to be located at any particular position (e.g., they could be separated).

According to this embodiment, the data and mask parity fields may be masked during a query. Consider, for example, an eight bit wide entry having a single data parity bit and a single mask parity bit:

TABLE III

| | $b_7$ | $b_6$ | $b_5$ | $b_4$ | $b_3$ | $b_2$ | $b_1$ | $b_0$ |
|---|---|---|---|---|---|---|---|---|
| data: | | | data content | | | | DP | 1 |
| mask: | | | mask content | | | | 1 | MP |

When a query is provided to the TCAM unit 110, the data parity information is masked because of the "1" located in bit $b_1$ of the mask portion 420. Moreover, bit $b_0$ in the query key can be set to "1" to mask the mask parity information (because that "1" will match bit $b_0$ of the data portion 410). According to another embodiment, bit $b_0$ in the data portion 410 and the key are both set to zero to mask the mask parity information. In other words, as long as the corresponding locations in the data portion 410 and the key are the same, the mask parity information can be masked during a query. For example, if the mask parity information is four bits, the locations corresponding to those four bits in the data portion 410 and the key could both be set to "0101" to mask the mask parity information.

Parity Check Engine

Figure 5:
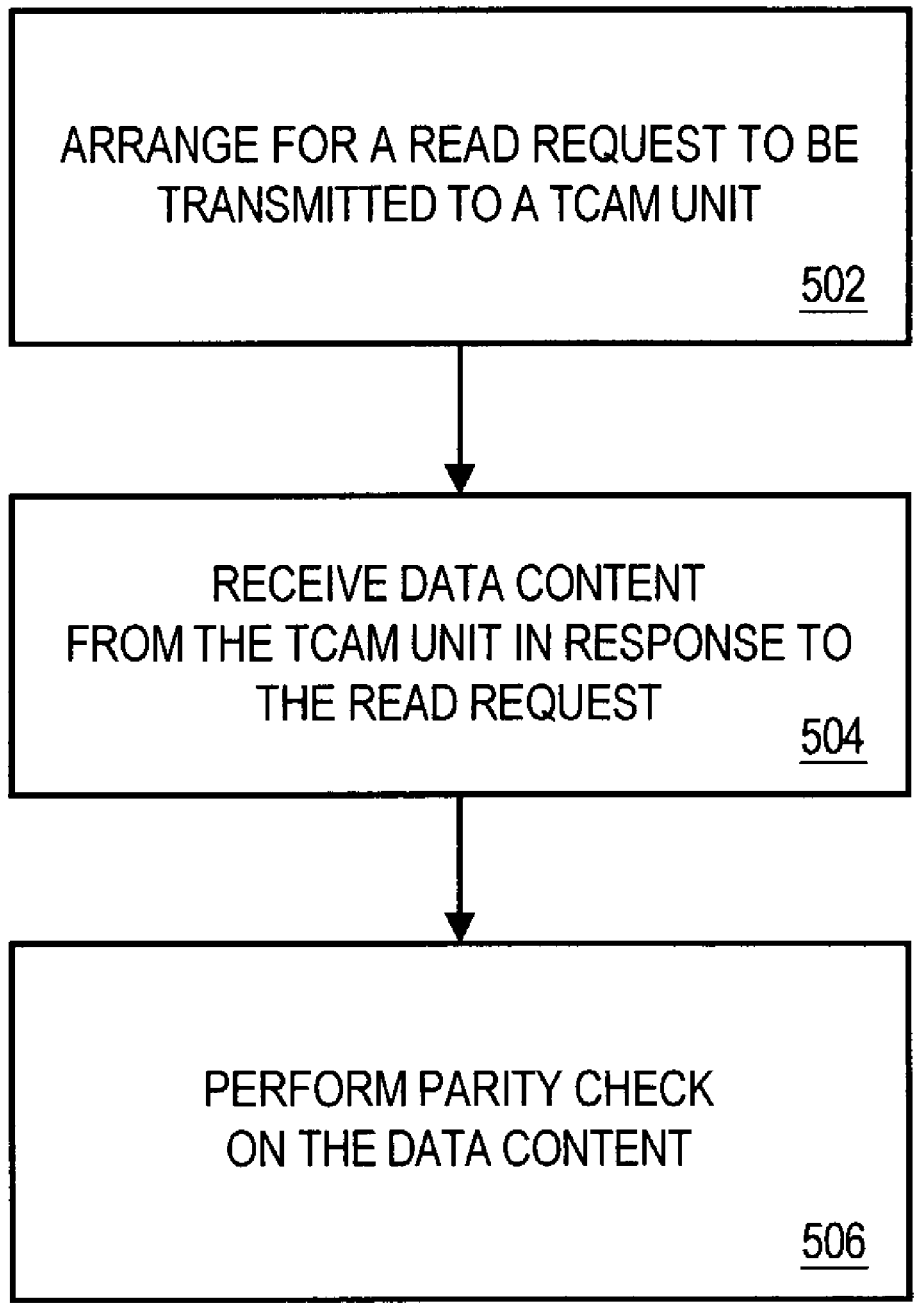
FIG. 5 is a method of performing a TCAM parity check according to some embodiments.

FIG. 5 is a method that may be performed, for example, by the parity check engine 130 according to some embodiments. At 502, it is arranged for a read request to be transmitted to the TCAM unit 110. For example, the parity check engine 130 may transmit the read request to the arbiter unit 140 (which can then forward the request to the TCAM unit 110). According to another embodiment, the parity check engine 130 transmits a read instruction directly to the TCAM unit 110 (e.g., after receiving permission from the arbiter unit 140).

The read request transmitted to the TCAM unit 110 includes a memory address associated with memory cells that will be checked by the parity check engine 130. According to some embodiments, the parity check engine 130 selects the memory addresses sequentially. For example, the parity check engine 130 might start with the first memory address and increment the address after the memory cells are checked (and the memory address may wrap back to the first memory address after the memory cells associated with the last memory address are checked). According to another embodiment, parity check engine 130 instead starts with the last memory address and decrements the address. In yet another embodiment, the memory addresses are not selected sequentially (e.g., they may be selected randomly or pseudo-randomly).

At 504, data content is received from the TCAM unit 110 in response to the read request. The data content may be received, for example, directly from the TCAM unit 110 or via the arbiter unit 140

At 506, a parity check is performed on the data content. For example, hardware or software associated with the parity check engine 130 may execute a parity function (e.g., an exclusive OR operation) on the data content to generate a parity result.

According to some embodiments, the parity check engine 130 also receives parity information (e.g., data parity information) from the TCAM unit 110 in response to the read request. According to another embodiment, the parity check engine 130 retrieves parity information associated with the memory address being checked from a separate data structure. In either case, the parity result generated by the parity check engine 130 can be compared to the parity information to determine if a soft error has occurred in the memory cells. If an error is detected (e.g., the parity result does not match the parity information), the parity check engine 130 may, for example, flag the error to a user or an application.

Similarly, the parity check engine 130 can receive mask content from the TCAM unit 110 in response to a read request and perform a parity check on the mask content (e.g., based on mask parity retrieved from the TCAM unit 110 or a separate memory structure).

Arbiter Unit

Figure 6:
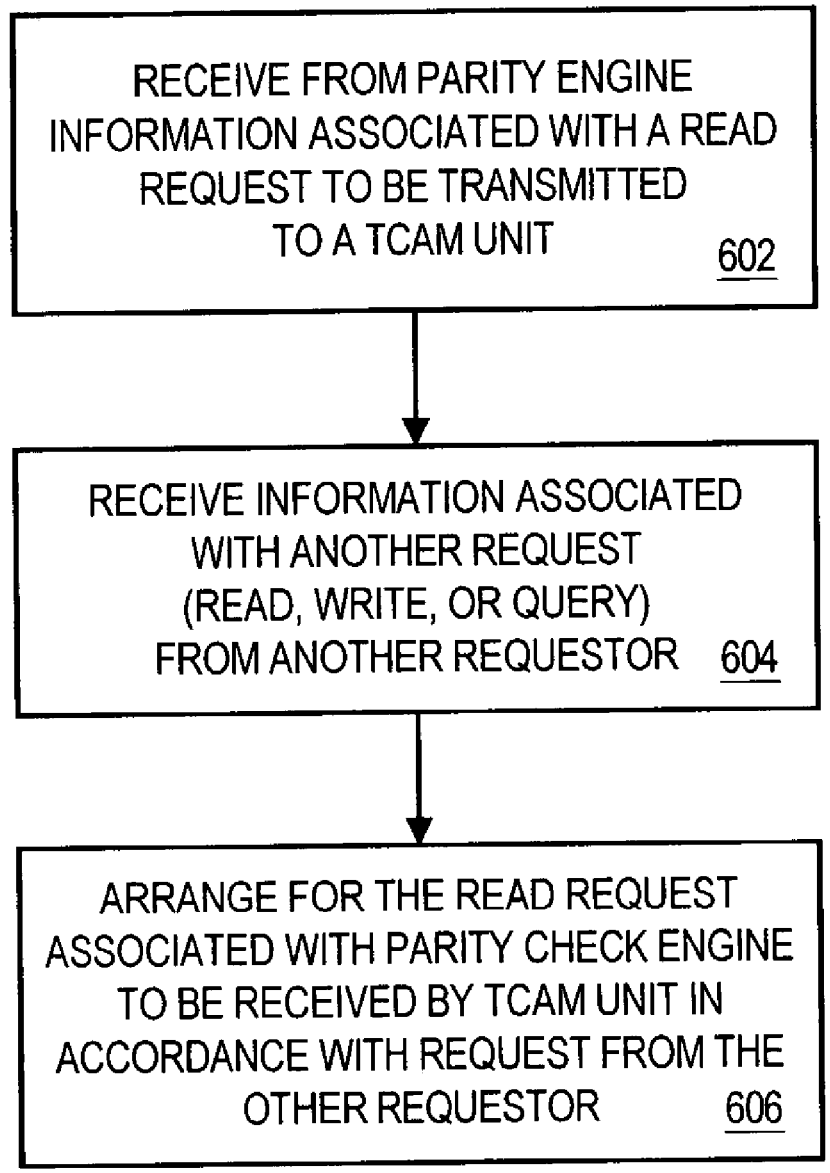
FIG. 6 is a method performed by an arbiter unit according to some embodiments.

FIG. 6 is a method that may be performed, for example, by the arbiter unit 140 according to some embodiments. At 602, information is received indicating that the parity check engine 130 wants to transmit a read request to the TCAM unit 110. At 604, information is received indicating that another requestor 120 wants to transmit another request to the TCAM unit 110. For example, the other requestor 120 might want to transmit a write request, another read request, or a query request to the TCAM unit 110.

At 604, the arbiter unit 140 arranges for the read request associated with the parity check engine 130 to be received by the TCAM unit 110 after arbitration between that request and the request from the other requestor. For example, the arbiter unit 140 might accept a read request from the parity check engine 130 only when there is no request from the other requestor 120 (e.g., read requests from the parity check engine 130 may only be accepted during cycles in which the TCAM unit 110 is otherwise free). According to another embodiment, the arbiter unit 140 may accept read requests from the parity check engine 130 periodically (e.g., every ten cycles—even if there is a request from the other requestor 120).

Network Device

Figure 7:
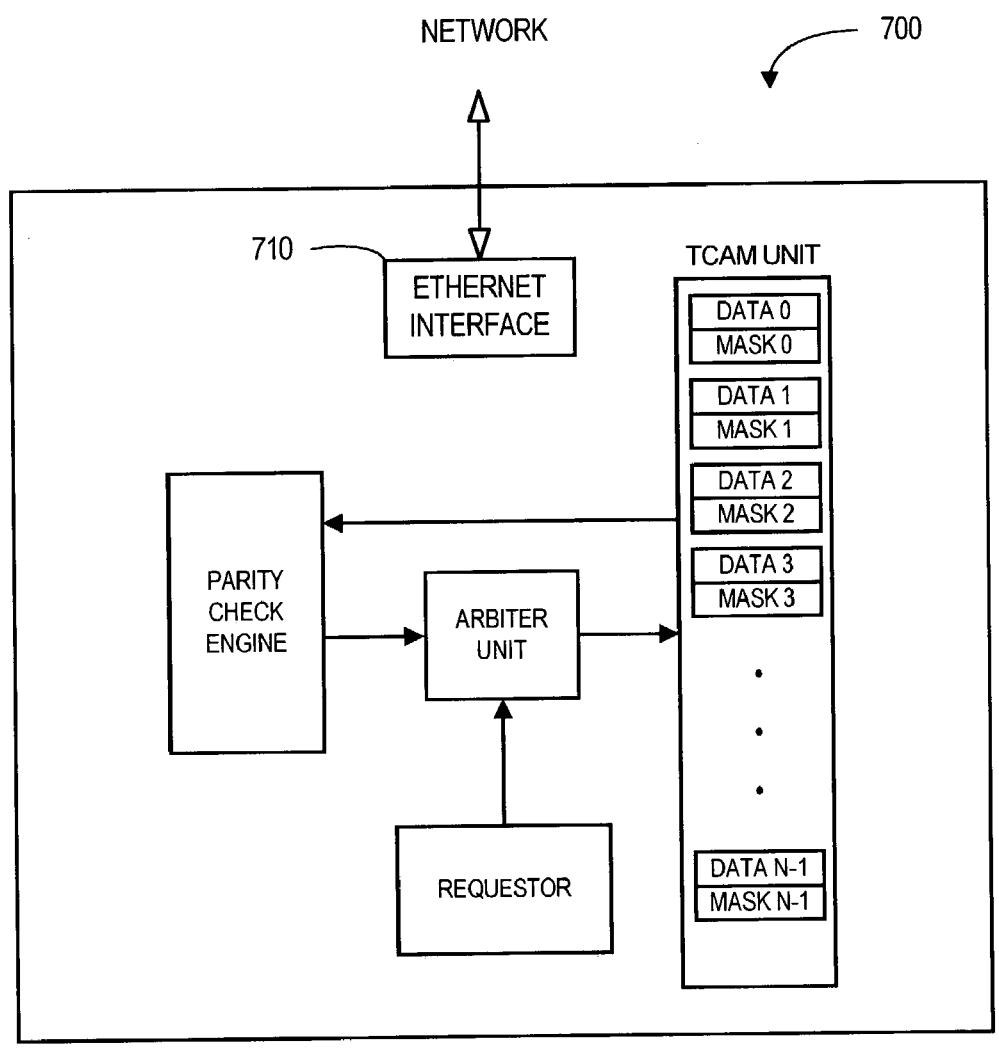
FIG. 7 is a network device according to some embodiments.

FIG. 7 is a network device 700, such as a network switch or router, according to some embodiments. The network device 700 may, for example, exchange packets of information via an Ethernet interface 710 in accordance with the Fast Ethernet Local Area Network (LAN) transmission standard 802.3-2002® published by the Institute of Electrical and Electronics Engineers (IEEE). In other embodiments, the network device 700 exchanges information in accordance with other communication protocols.

The network device 700 may include a network processor, such as a INTEL® IXP2400 or IXP2800 network processor. Moreover, the network device 700 may include any of the embodiments described herein. For example, the network device 700 may include a TCAM unit, a parity check engine, and an arbiter unit.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although a separate parity check engine 130 and arbiter unit 140 were illustrated in FIG. 1, according to other embodiments the arbiter unit 140 performs the functions described with respect to the parity check engine 130 (e.g., selecting memory addresses and executing a parity function on data content received from the TCAM unit 110). According to another embodiment, no arbiter unit 140 is needed (e.g., the parity check engine 130 may decide when a read request will be transmitted to the TCAM unit 110).

In addition, although an exclusive OR parity function was described, other types of parity functions, including those that generate multi-bit results, may be used instead.

The several embodiments described herein are solely for the purpose of illustration. Persons skilled in the art will recognize from this description other embodiments may be practiced with modifications and alterations limited only by the claims.

What is claimed is:

1. A ternary content addressable memory unit storing a plurality of entries, each entry comprising:
   a data content field;
   a data parity field;
   a mask content field; and
   a mask parity field in a location associated with the data parity field, wherein a location in a global mask associated with the data and mask parity fields is to be set to a pre-determined value when the memory unit is queried.

2. An apparatus, comprising:
   a ternary content addressable memory unit to store a plurality of entries, each entry including:
      a data content field,
      a data parity field,
      a mask content field, and
      a mask parity field in a location associated with the data parity field, wherein a location in a global mask associated with the data and mask parity fields is to be set to a pre-determined value when the memory unit is queried;
   a requestor unit to send a query request to the memory unit;
   a parity check engine to perform a parity check on data content in the memory unit; and
   an arbiter unit coupled to the memory unit, the requestor unit, and the parity check engine.

3. The apparatus of claim 2, wherein the arbiter unit is to grant a read request associated with the parity check engine in accordance with requests from the requestor.

4. The apparatus of claim 2, further comprising:
an Ethernet interface.

5. The apparatus of claim 2, wherein the apparatus is associated with at least one of (i) a switch or (ii) a router.

6. A method, comprising:
arranging for a read request to be transmitted to a ternary content addressable memory unit, the memory unit having entries that each include (i) a data content field, (ii) a data parity field, (iii) a mask content field, and (iv) a mask parity field in a location associated with the data parity field;
receiving data content from the memory unit in response to the read request;
performing a parity check on the data content; and
using a global mask signal, including a predetermined value at the location associated with the data and mask parity fields, to mask parity information when querying the memory unit.

7. The method of claim 6, wherein said performing comprises executing a parity function on the data content to generate a parity result.

8. The method of claim 7, further comprising:
receiving parity information from the memory unit in response to the read request; and
comparing the parity result to parity information.

9. The method of claim 7, wherein said performing further comprises:
comparing the parity result to parity information stored in a memory structure separate from the memory unit.

10. The method of claim 7, wherein the parity function is associated with an exclusive OR operation.

11. The method of claim 6, wherein said arranging is facilitated by an arbiter unit.

12. The method of claim 11, wherein the arbiter is to also facilitate at least one of:
(i) write requests, (ii) other read requests, and (iii) and query requests for the memory unit from another requestor.

13. The method of claim 12, wherein the arbiter schedules the request in accordance with requests from the other requestor.

14. A ternary content addressable memory unit storing a plurality of entries, each entry comprising:
a data content field; and
a first data parity field;
a mask content field;
a first mask parity field;
a second data parity field in a location associated with the first mask parity field; and
a second mask parity field in a location associated with the first data parity field, wherein the second data and mask parity fields are to be set to a pre-determined value when the memory unit is queried.

15. An apparatus, comprising:
a ternary content addressable memory unit to store a plurality of entries, each entry including:
a data content field;
a first data parity field;
a mask content field;
a first mask parity field;
a second data parity field in a location associated with the first mask parity field; and
a second mask parity field in a location associated with the first data parity field,
wherein the second data and mask parity fields are to be set to a pre-determined value when the memory unit is queried;
a requestor unit to send a query request to the memory unit;
a parity check engine to perform a parity check on data content in the memory unit; and
an arbiter unit coupled to the memory unit, the requestor unit, and the parity check engine.

16. The apparatus of claim 15, wherein the arbiter unit is to grant a read request associated with the parity check engine in accordance with requests from the requestor.

17. The apparatus of claim 15, further comprising:
an Ethernet interface.

18. The apparatus of claim 15, wherein the apparatus is associated with at least one of (i) a switch or (ii) a router.

19. A method, comprising:
arranging for a read request to be transmitted to a ternary content addressable memory unit, the memory unit having entries that each include (i) a data content field, (ii) a first data parity field, (iii) a mask content field, (iv) a first mask parity field, (v) a second data parity field in a location associated with the first mask parity field, and (vi) a second mask parity field in a location associated with the first data parity field;
receiving data content from the memory unit in response to the read request;
performing a parity check on the data content; and
using a global mask signal, including pre-determined values at the second data and mask parity fields, to mask parity information when querying the memory unit.

20. The method of claim 19, wherein said performing comprises executing a parity function on the data content to generate a parity result.

21. The method of claim 20, further comprising:
receiving parity information from the memory unit in response to the read request; and
comparing the parity result to parity information.

22. The method of claim 20, wherein said performing further comprises:
comparing the parity result to parity information stored in a memory structure separate from the memory unit.

23. The method of claim 20, wherein the parity function is associated with an exclusive OR operation.

24. The method of claim 19, wherein said arranging is facilitated by an arbiter unit.

25. The method of claim 24, wherein the arbiter is to also facilitate at least one of: (i) write requests, (ii) other read requests, and (iii) and query requests for the memory unit from another requestor.

26. The method of claim 25, wherein the arbiter schedules the request in accordance with requests from the other requestor.

* * * * *